United States Patent [19]
Norris

[11] Patent Number: 5,984,688
[45] Date of Patent: Nov. 16, 1999

[54] IEEE 1386 COMPLIANT PMC CARD WHICH PERMITS USE OF PCMCIA CARDS

[76] Inventor: Joseph P. Norris, 412A Willow Turn, Mt. Laurel, N.J. 08054

[21] Appl. No.: 08/696,334

[22] Filed: Aug. 13, 1996

[51] Int. Cl.$^6$ ................................................. H01R 23/68
[52] U.S. Cl. .............................. 439/64; 439/945; 361/756
[58] Field of Search ............................... 439/76.1, 61, 79, 439/80, 64, 377, 945; 361/741, 756

[56] References Cited

U.S. PATENT DOCUMENTS

| | | | |
|---|---|---|---|
| 4,772,562 | 9/1988 | Lau | 439/368 |
| 5,113,317 | 5/1992 | Howe | 361/756 |
| 5,163,833 | 11/1992 | Olsen et al. | 439/61 |
| 5,454,725 | 10/1995 | Speiser et al. | 439/61 |
| 5,576,935 | 11/1996 | Freer et al. | 361/785 |

OTHER PUBLICATIONS

IBM Technical Disclosure Bulletin, vol. 40, No. 11, p. 149, Nov. 1997.

*Primary Examiner*—Neil Abrams
*Attorney, Agent, or Firm*—Laurence A. Weinberger

[57] ABSTRACT

A PMC (PCI Mezzanine Card) is disclosed which complies with the IEEE 1386 form factor specification and incorporates a PCMCIA card connector so that readily available PCMCIA cards can be used with a PMC. By removing approximately one-half of the usual PMC printed circuit board, space is created in which to mount the PCMCIA connector so that it is contained within the allowed component envelope above and below the surface of the PMC circuit board (4). The PCMCIA connector (10) is mounted by its leads to a tab (9) extending from circuit board (4). Side rails (15) having an s-shaped bend (18) extend from the circuit board (4) and provide mounting support for the bezel supports (2) thereby meeting the overall size requirements for PMC cards under the IEEE 1386 standard. The design of this invention also permits securing PCMCIA cards in the PCMCIA connector with set screws (21) that may be used to push in on extensions (13).

2 Claims, 4 Drawing Sheets

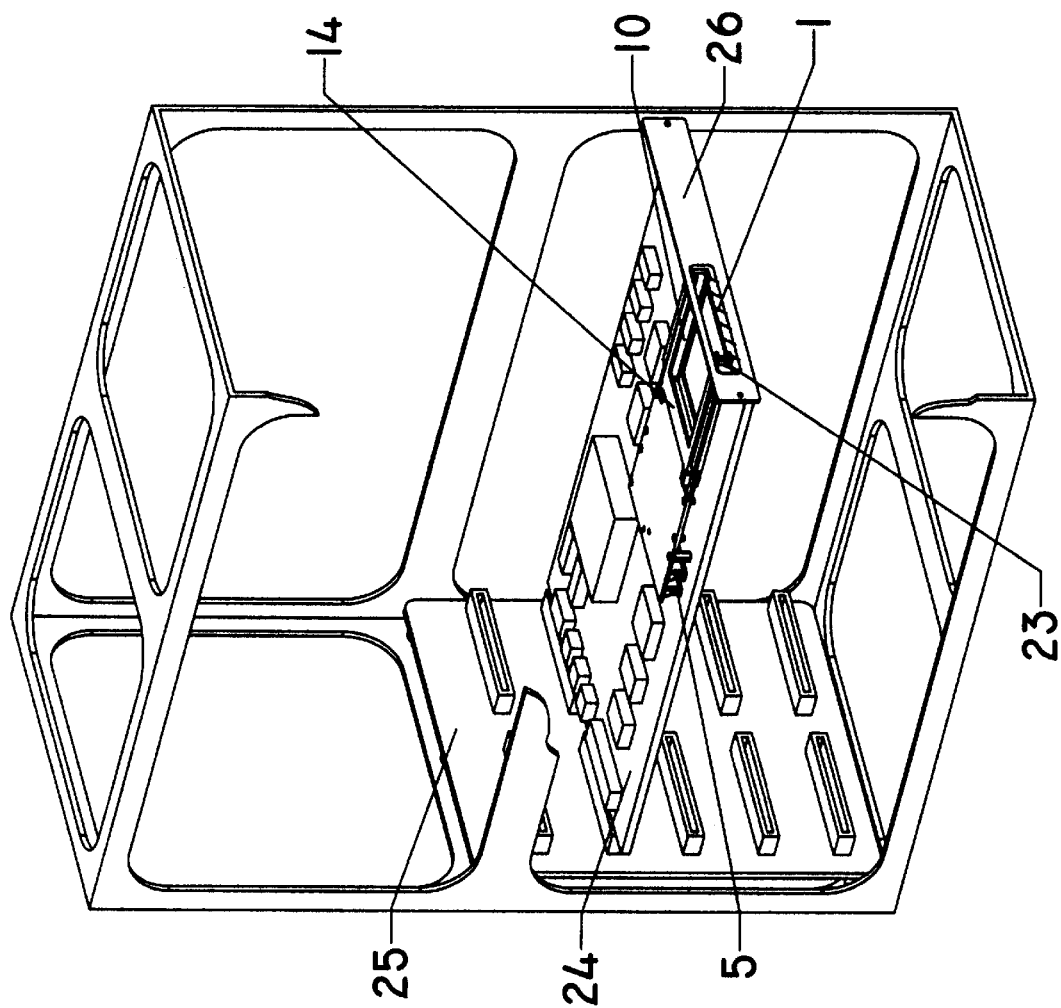

IEEE 1386 COMPLIANT PMC CARD WHICH PERMITS USE OF PCMCIA CARDS

BACKGROUND OF THE INVENTION

1. Field of the invention

The present invention relates to mezzanine cards such as those which may be used on VMEbus, CompactPCI, and other host processor boards, and more particularly to a PMC card which complies with the IEEE 1386 specification and permits the use of standard Type I and Type II PCMCIA cards.

2. Description of the Prior Art

Over the past few years, several backplane buses have evolved which permit the configuration of a computer system using standardized host processor cards which communicate along the backplane bus. Examples of such buses are the VMEbus and the CompactPCI. Generally, the host cards contain appropriate micro-processors, co-processors, and necessary associated memory. Many times the host processor cards do not provide for I/O. The host cards are constructed so that they can perform a general computational function and are further specialized by the individual auxiliary cards which mount onto the host cards. Since these auxiliary cards mount just above and parallel to the host card, the auxiliary cards are generally referred to as "mezzanine cards".

Typically, mezzanine cards have dimensions smaller than the host processor card and plug directly into the host card through appropriate connectors. Host cards often provide for more than one mezzanine card. A myriad of mezzanine cards have been developed for the board/backplane market. One source has identified at least thirty different mezzanine board variations just for use on the VMEbus. In order to eliminate the confusion and duplication required by having proprietary mezzanine cards for each of the host processor cards and each of the buses, the IEEE has been working to develop a single standard for mezzanine cards which would enable them to be used with any host processor on any bus.

The resulting IEEE 1386 specifications have two major components, a local bus requirement as expressed in IEEE 1386.1 and a mechanical requirement as Expressed in IEEE 1386. First, IEEE 1386.1 requires that the bus between the mezzanine card and the host card conform to the Peripheral Component Interconnect (PCI) bus. The Peripheral Component Interconnect bus is a non-terminated, non-incident wave switching bus running synchronously at 33 MHz, in typical implementations. It is intended to be a local bus as opposed to a backplane bus. PCI offers a parity-protected 32-bit multiplexed data/address bus, with an option for a 64-bit extension. Most PCI implementations use a 32-bit bus. Because of PCI's local-bus bandwidth—132 MB/s peak—high speed applications, such as 100-Base-T, Fiber Channel, and Asynchronous Transfer Mode (ATM) will work exceptionally well, as compared to implementations with prior-generation mezzanine card standards.

Using a PCI bus increases the transfer rate by as much as ten-fold over several prior generation proprietary mezzanine cards. At the same time, low speed applications, using only a small percentage of the available PCI bandwidth, also work well and provide cost-effective solutions. Finally, the PCI bus technology was chosen since it is found in tens of millions of desktop personal computers where the economies of scale have reduced the cost of PCI interfaces by taking advantage of the personal computer market's economies of scale. Mezzanine cards built to the IEEE 1386.1 standard with PCI buses are therefore known as PCI Mezzanine Cards, abbreviated as PMC.

Presently, one of the principal product lines available in the computer market are PCMCIA cards which are particularly prevalent in the laptop and portable personal computing market. PCMCIA cards are approximately credit-card sized modules which may contain any number of different functions. Typical functions available through PCMCIA technology are modems, flash mass storage, rotational magnetic storage, and LAN interfaces. Additionally, data acquisition cards are becoming available at reasonable cost. Ideally, it would be desirable to use the relatively inexpensive and widely available PCMCIA cards in I/O applications for the backplane market.

IEEE 1386 specifies a defined mechanical configuration for PMC cards. As can be seen in FIG. 1, a typical PMC consists of a front-panel bezel 1, bezel supports 2, stand-offs 3, printed circuit board 4, and at least two 64-pin connectors 5 towards the rear of the card. The front panel bezel 1 engages with the front panel of a host processor board producing an EMI-tight seal and providing a suitable opening for external I/O connectors. Typically, there are also threaded holes 6 provided in the bezel mounting supports 2 which permit mechanical attachment to the host board. The PMC cards are mounted parallel to the host processor card and are held in position by screws mounted through the host processor card into the stand-offs 3 and into the threaded holes 6 in the bezel supports 2. The rear 64-pin connectors 5 carry the PCI bus and user-defined I/O. In the terminology of the IEEE 1386 specification, the side 7 of the printed circuit board 4 facing the host processor board is designated as side 1 and the other side 8 of the printed circuit board 4 is designated as side 2. The IEEE 1386 specification provides for both a single wide as well a double wide PMC card. The single wide card measures 149×74 mm (roughly 6×3").

The "stacking height" of the PMC is defined as the distance between the Side 1 surface of the PMC printed circuit board and the surface of the host card printed circuit board immediately opposite side 1 of the PMC. The stacking height varies depending upon the type of the host processor board. For VMEbus host boards, for example, the stacking height is 10 mm. Other host processor boards may use a different stacking height. The stacking height is important for two reasons: (1) some space must be left for air flow between the PMC card and the host processor board; and (2) components on the host processor and the PMC must not mechanically engage/interfere with each other. As will be seen below, the IEEE 1386 specification for PMC cards standardizes the cards so that stacking height variations are governed solely by the mechanics of the host processor. In this way, standardized PMC cards can be universally applied in any stacking height context.

The component envelope for PMC cards includes the height of components on both sides of the board, plus the printed circuit board thickness. The component envelope is specified to be no greater than 8.2 mm in the primary component area of the board. Maximum height of components on side 1 of the PMC (which faces the host card) is set at 4.7 mm which is ample enough to handle most surface mount integrated circuit packaging. The maximum height (measured from the side 1 surface) of components on side 2 of the PMC is 3.5 mm. Considering that a typical printed circuit board is approximately 1.5 mm thick, approximately 2.0 mm remain for side 2 components. This height can accommodate SOICs, QSOPs, TQFP, passive components and other low-profile surface mount technologies. Since the PMC component envelope will always be no thicker than 8.2 mm, host card manufacturers are responsible for designing cards so that none of the host card components will mechanically contact a mounted PMC. For VMEbus host cards, a maximum height of components on the side of the host card facing the PMC card is set at 4.7 mm. Clearly, for other host processor cards with a different stacking height, components on the host card may protrude a greater distance from the host card without striking the PMC card. In addition, the stacking height for each host card implementation will govern how high off the host board the 64-pin connectors need to be mounted.

As noted above, in the ideal world it would be possible to use the mass-marketed PCMCIA cards with PMC cards. However, PCMCIA connectors, which provide both electrical and physical support, designed to receive Type I and Type II PCMCIA cards typically measure approximately 7 mm thick. This thickness is required to accommodate the 5 mm thickness of the Type II card as well as the 3 mm thickness of the Type I card. Some PMC cards capable of receiving a PCMCIA card are presently available in the marketplace. However, the manufacturers have mounted the PCMCIA connector on the surface of the PMC printed circuit board, and as a consequence have grossly violated the IEEE 1386 specification. The advantage of the standardization provided by the IEEE 1386 specification is therefore lost and these PCMCIA to PMC adapter cards must be checked against the configuration of each host processor board to see if there is mechanical interference. As the PCMCIA cards have become more popular and less expensive, there has been a strong desire to utilize these cards in conjunction with PMC cards, but until this invention, there has been no way to obtain the convenience of using a PCMCIA card on a PMC and retain all advantages of the IEEE 1386 specifications.

SUMMARY OF THE INVENTION

This invention solves the problem of accommodating PCMCIA cards within the allowed component envelope for the PMC card according to the IEEE 1386 specification. Thus, this invention makes it possible to use readily available PCMCIA cards as I/O cards for computers built around board/backplane buses. In the preferred embodiment this invention accomplishes this task by altering the construction of a typical PMC card in four significant ways. First, the PCI components and other electronics are mounted within approximately the top 1/3 to 1/2 of the card nearest the PMC host board connectors. Second, approximately one-half of the printed circuit board is cut away so that the space previously occupied by the circuit board can be occupied by the PCMCIA socket connector. Third, the PCMCIA connector is placed so that its thickness falls within the component envelope. Fourth, side rails are provided to mount the bezel and its supports so that the card complies with the IEEE 1386 dimensional standards in all manner.

It is an object of this invention to provide a means for mounting a standard PCMCIA socket connector on a PMC card in such a manner that the connector does not extend outside the component envelope specified in IEEE 1386.

It is a further object of this invention to provide a design for a PMC card that incorporates a PCMCIA socket connector which conforms to the IEEE 1386 dimensions for PMC cards.

It is a further object of this invention to provide a means for supporting the bezel on a PMC card from which approximately one-half of the printed circuit board has been removed to make room for a PCMCIA socket connector.

It is another object of this invention to provide a locking mechanism which will secure PCMCIA cards within a PMC card.

Further objects of this invention will become apparent from the detailed description of the invention which follows.

DESCRIPTION OF THE FIGURES

FIG. 4 shows a schematic of a conventional computer housing structure with a standardized host processor card mounted into a backplane bus with the device of this invention mounted to the host processor card.

DESCRIPTION OF THE PREFERRED EMBODIMENT

Figure 1:
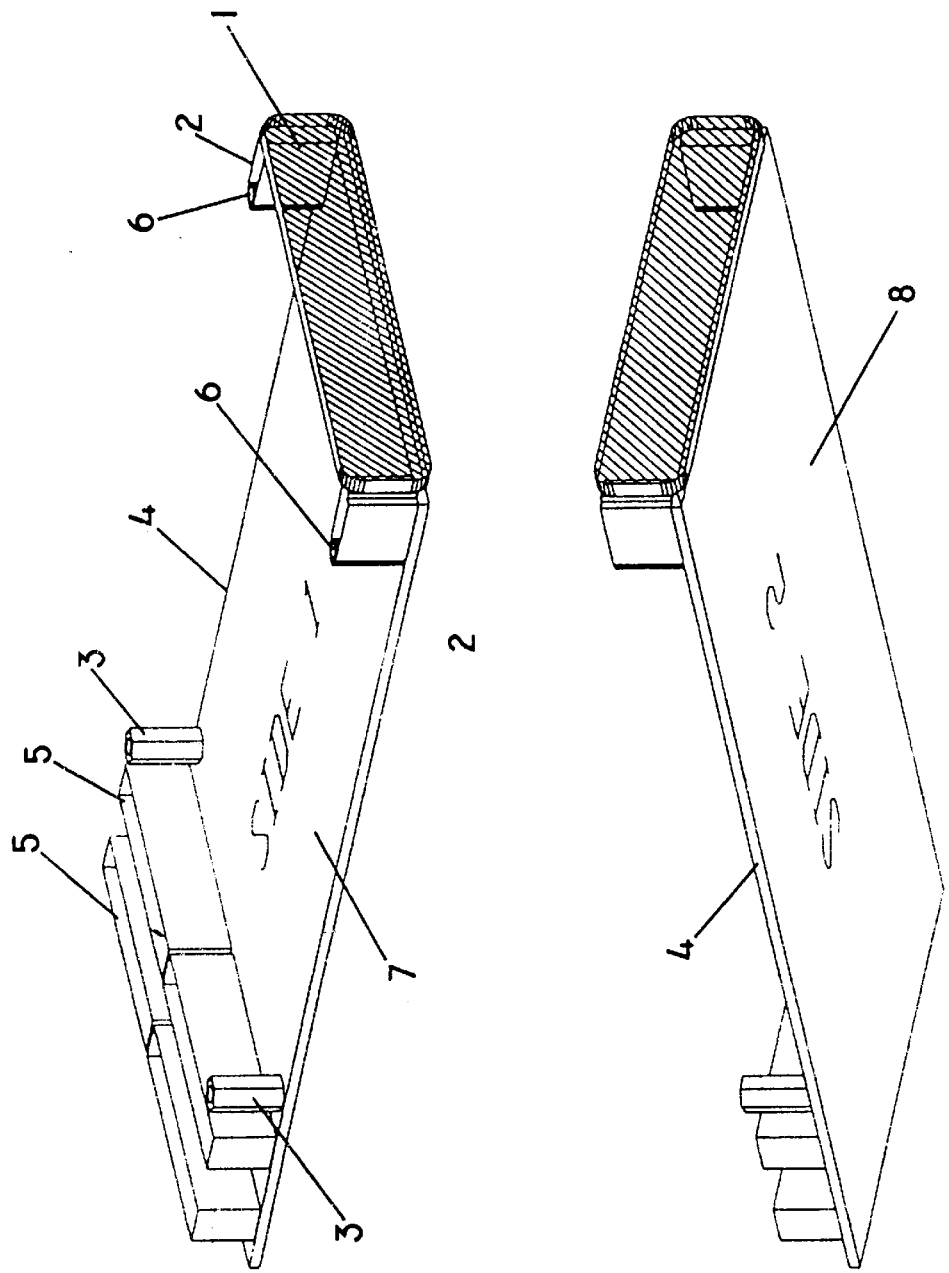
FIG. 1 shows an isometric view of a typical PMC card.
Figure 2:
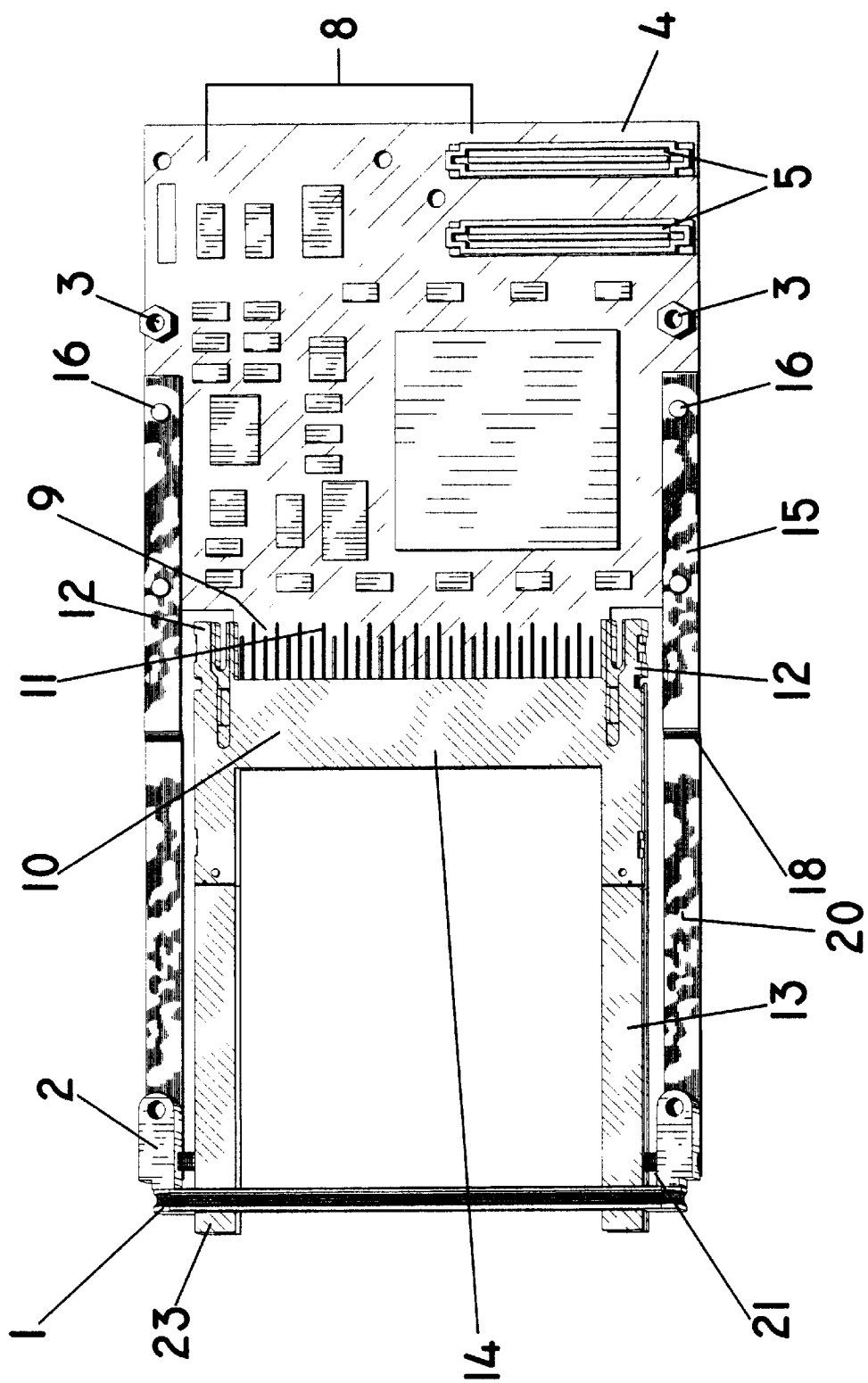
FIG. 2 shows a top view of the PMC card of this invention.

FIG. 2 shows a top view of the PMC card of the invention. The two 64-pin electrical connectors 5 and the two standoffs 3 are placed at the rear of printed circuit board 4 in accordance with the IEEE 1386 specification. The various chips necessary for electrical function are mounted in an area 8 towards the 64-pin connector end of the card. The printed circuit board 4 itself extends only approximately one-half of the length allowed by the IEEE 1386 specification for the outside dimensions of the PMC. At its interior end, printed circuit board 4 has a short tab 9 upon which are located the electrical connections for PCMCIA connector 10. Tab 9 is narrower than the full width of printed circuit board 4 in order to accommodate the extensions 12 of PCMCIA connector 10.

PCMCIA connector 10 is fastened to circuit board 4 by means of electrical leads 11 which are soldered to circuit board 4 on tab 9. Since 68 electrical leads 11 are used for PCMCIA, a strong mechanical connection is achieved by soldering just these leads 11 to board tab 9. The body of PCMCIA connector 10 has a generally foreshortened "H" shape with short extensions 12 off cross member 14 at one end and longer extensions 13 at the other end. Extensions 12 fit on each side of circuit board tab 9. The exact shape of circuit board tab 9 will depend on the design of the PCMCIA connector 10 with the sides of tab 9 essentially being cut away so that the shape of tab 9 mirrors the shape of the lead end of PCMCIA connector 10. In this manner, slight variations in the shape of the PCMCIA connector 10 can be accommodated.

Figure 3:
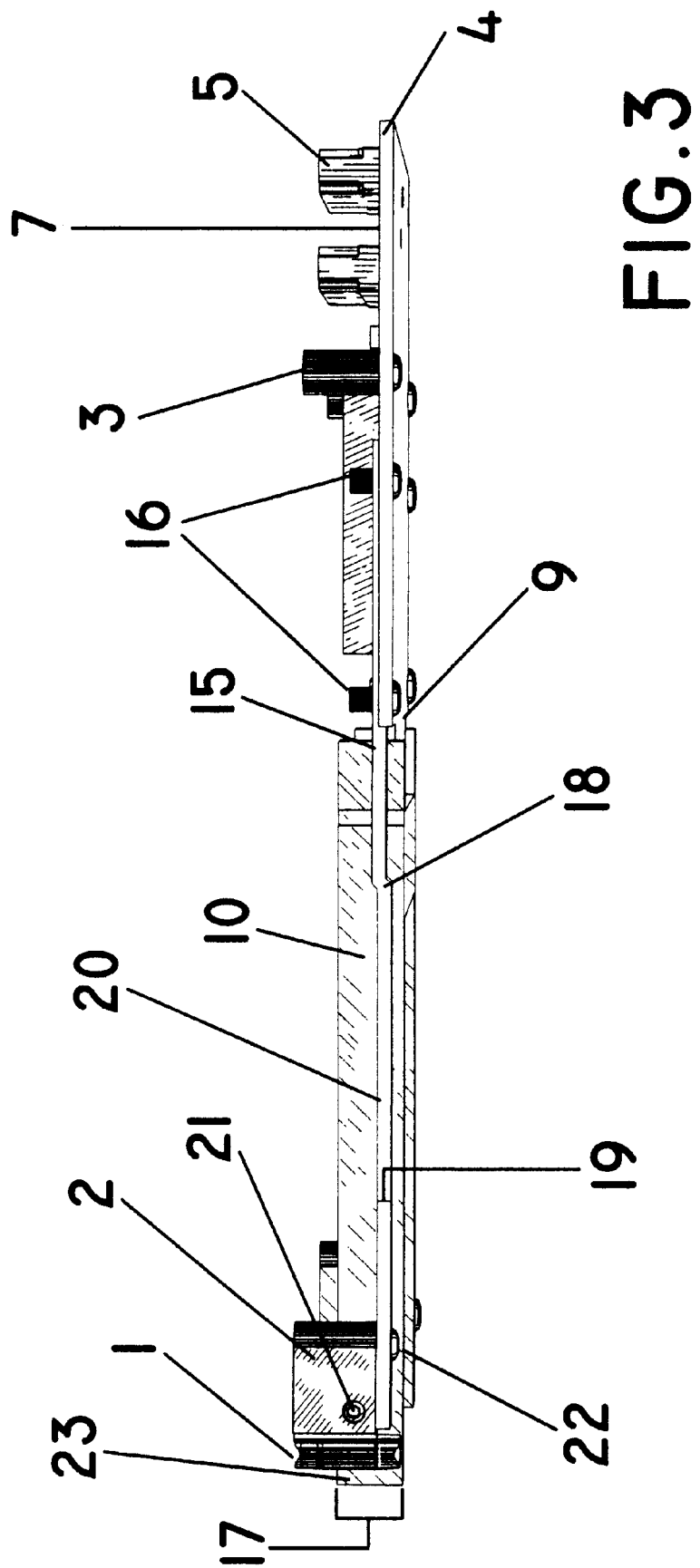
FIG. 3 shows a side view of the PMC card of this invention.

Referring to FIG. 3, it can be seen that a critical feature of this invention is that PCMCIA connector 10 is so mounted to tab 9 that the body thickness 17 of connector 10 is disposed both above and below circuit board 4. In this manner, the body thickness 17 is kept entirely within the component envelope specified by IEEE 1386. In the preferred embodiment, the top of connector 10 does not extend above the surface 7 of circuit board 4 by more than the allowed 4.7 mm. In this manner, the present invention solves the problem of mounting PCMCIA connectors on PMC cards without violating the IEEE 1386 specification. As a result, both Type I and Type II PCMCIA cards can now be used with host processor boards. PCMCIA connectors having a thickness of up to slightly less than the component envelope can be accommodated by the design of this invention. Depending upon the exact dimensions chosen for circuit board 4, the open end 23 of connector 10 may extend beyond bezel 1.

In the preferred embodiment, side rails 15 are mounted to side 1 of circuit board 4 with fasteners 16 and extend beyond the tab 9 end of circuit board 4. A second critical feature of this invention is the s-shaped bend 18 in side rails 15. If side rails 15 projected unbent off of circuit board 4, bezel supports 2 and bezel 1, when mounted to side rails 15, would extend further above the surface 7 of circuit board 4 than is allowed by the IEEE 1386 specification and stacking heights would be violated. To solve this problem, side rails 15 have substantially the same thickness 19 as circuit board 4 and are bent so that the top surface 20 of each rail after the bend is coplanar with the top surface 7 of circuit board 4. Bend 18 may be located anywhere along the length of side rail 15 extending beyond the end of circuit board 4 so long as the position of bend 18 leaves space for mounting bezel supports 2. Thus, when bezel supports 2 are mounted on the ends of side rails 15 with fasteners 22, both the height and length of the PMC conforms with the IEEE 1386 standard.

PCMCIA cards have female connectors on one end which mate with the male connectors housed in the PCMCIA connector. A fairly secure fit is achieved, but the PCMCIA cards can work loose over time due to ambient vibrations. This problem is also overcome by the card of this invention by utilizing two set screws 21 one in the side of each bezel support 2. After the PCMCIA card is installed in connector 10, set screws 21 can be advanced to push in on extensions 13. Extensions 13 in turn grasp and securely hold the PCMCIA card in place.

FIG. 4 shows a schematic of a conventional computer housing structure with a standardized host processor card 24 mounted into a backplane bus 25. The device of the present invention is shown mounted on and connected to host card 24 by connectors 5 with the bezel 1 and PCMCIA connector 10 extending through a slot in cover panel 26.

I claim:

1. A PCMCIA PMC adapter board complying with the IEEE 1386 specifications comprising:

a. a PCMCIA connector;

b. a printed circuit board sized so that when joined to the PCMCIA connector, the PCMCIA connector does not extend substantially beyond the bezel position specified by IEEE 1386 and the PCMCIA connector is contained within the component envelope specified by IEEE 1386;

c. means for electrically and mechanically fastening the PCMCIA connector to the printed circuit board;

d. two side rails, having substantially the same thickness as the printed circuit board, extending from each side of the printed circuit board and each being bent in an s-shaped bend wherein when the bottom of each rail contacts the top of the printed circuit board and beyond the s-shaped bend the top of each rail is substantially coplanar with the surface of the printed circuit board;

e. means for fastening the two side rails to the printed circuit board;

f. two bezel supports; and g. means for fastening each bezel support at the end of each side rail.

2. A PCMCIA PMC adapter board complying with the IEEE 1386 specifications comprising:

a. a PCMCIA connector;

b. a printed circuit board sized so that when joined to the PCMCIA connector, the PCMCIA connector does not extend substantially beyond the bezel position specified by IEEE 1386 and the PCMCIA connector is contained within the component envelope specified by IEEE 1386;

c. means for electrically and mechanically fastening the PCMCIA connector to the printed circuit board;

d. two side rails, having substantially the same thickness as the printed circuit board, extending from each side of the printed circuit board and each being bent in an s-shaped bend wherein when the bottom of each rail contacts the top of the printed circuit board and beyond the s-shaped bend the top of each rail is substantially coplanar with the surface of the printed circuit board;

e. means for fastening the two side rails to the printed circuit board;

f. two bezel supports; and g. means for fastening each bezel support at the end of each side rail; and h. means for slightly compressing the PCMCIA connector whereby the connector firmly holds a PCMCIA card.

* * * * *